(12) United States Patent
Morikado et al.

(10) Patent No.: US 8,319,270 B2
(45) Date of Patent: Nov. 27, 2012

(54) SEMICONDUCTOR DEVICE AND METHOD FOR MANUFACTURING THE SAME

(75) Inventors: Mutsuo Morikado, Yokkaichi (JP);
Kiyomi Naruke, Sagamihara (JP);
Hiroaki Tsunoda, Yokohama (JP);
Tohru Maruyama, Kamakura (JP);
Fumitaka Arai, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/642,073

(22) Filed: Dec. 18, 2009

(65) Prior Publication Data

US 2010/0155812 A1 Jun. 24, 2010

(30) Foreign Application Priority Data

Dec. 22, 2008 (JP) ................. 2008-326023

(51) Int. Cl.
*H01L 29/788* (2006.01)

(52) U.S. Cl. ........ 257/316; 257/314; 257/315; 257/317; 257/318; 257/319; 257/320; 257/321

(58) Field of Classification Search ........... 257/314–321
See application file for complete search history.

(56) References Cited

U.S. PATENT DOCUMENTS

| | | | | |
|---|---|---|---|---|
| 5,929,480 A * | 7/1999 | Hisamune | .......... | 257/320 |
| 6,469,341 B1 * | 10/2002 | Sung et al. | .......... | 257/316 |
| 6,891,246 B2 * | 5/2005 | Aritome | .......... | 257/510 |
| 7,067,871 B2 * | 6/2006 | Ozawa | .......... | 257/315 |
| 7,132,331 B2 * | 11/2006 | Jang et al. | .......... | 438/259 |
| 7,151,295 B2 * | 12/2006 | Yaegashi et al. | .......... | 257/316 |
| 7,326,993 B2 * | 2/2008 | Kajimoto et al. | .......... | 257/315 |
| 7,414,284 B2 * | 8/2008 | Aritome | .......... | 257/316 |
| 7,649,221 B2 * | 1/2010 | Sakuma et al. | .......... | 257/314 |
| 7,696,558 B2 * | 4/2010 | Nakajima et al. | .......... | 257/315 |
| 7,842,996 B2 * | 11/2010 | Kikuchi et al. | .......... | 257/321 |
| 2003/0203594 A1 * | 10/2003 | Shimizu et al. | .......... | 438/424 |
| 2004/0046206 A1 * | 3/2004 | Yun et al. | .......... | 257/315 |
| 2004/0245564 A1 * | 12/2004 | Ogura et al. | .......... | 257/315 |
| 2005/0051829 A1 * | 3/2005 | Goto et al. | .......... | 257/310 |
| 2005/0212034 A1 * | 9/2005 | Sasago et al. | .......... | 257/315 |
| 2005/0280069 A1 * | 12/2005 | Mizushima et al. | .......... | 257/314 |
| 2006/0220105 A1 * | 10/2006 | Jeon et al. | .......... | 257/316 |
| 2006/0231885 A1 * | 10/2006 | Lee | .......... | 257/316 |
| 2007/0187749 A1 * | 8/2007 | Sugimae et al. | .......... | 257/316 |
| 2009/0166704 A1 * | 7/2009 | Higashitani | .......... | 257/316 |
| 2010/0230739 A1 * | 9/2010 | Yaegashi et al. | .......... | 257/316 |

FOREIGN PATENT DOCUMENTS

| JP | 11-261038 | 9/1999 |
|---|---|---|
| JP | 2006-186073 | 7/2006 |

* cited by examiner

*Primary Examiner* — Fernando L Toledo
*Assistant Examiner* — Mohammed Shamsuzzaman
(74) *Attorney, Agent, or Firm* — Finnegan, Henderson, Farabow, Garrett & Dunner, L.L.P.

(57) ABSTRACT

A non-volatile memory of a semiconductor device has a tunnel insulation film provided on the active area; a floating gate electrode provided on the tunnel insulation film; a control gate electrode provided over the floating gate electrode; and an inter-electrode insulation film provided between the floating gate electrode and the control gate electrode, wherein, in a section of the non-volatile memory cell in a channel width direction, a dimension of a top face of the active area in the channel width direction is equal to or less than a dimension of a top face of the tunnel insulation film in the channel width direction, and the dimension of the top face of the tunnel insulation film in the channel width direction is less than a dimension of a bottom face of the floating gate electrode in the channel width direction.

8 Claims, 11 Drawing Sheets

BIT LINE DIRECTION
(CHANNEL LENGTH
DIRECTION)

WORD LINE DIRECTION
(CHANNEL WIDTH DIRECTION)

SEMICONDUCTOR DEVICE AND METHOD FOR MANUFACTURING THE SAME

CROSS-REFERENCE TO RELATED APPLICATION

This application is based upon and claims the benefit of priority from the prior Japanese Patent Application No. 2008-326023, filed on Dec. 22, 2008, the entire contents of which are incorporated herein by reference.

BACKGROUND OF THE INVENTION

1. Field of the Invention

The present invention relates to a semiconductor device including a non-volatile memory cell having a floating gate electrode and a control gate electrode, and its manufacturing method.

2. Background Art

As one of semiconductor storage devices, there is a non-volatile semiconductor memory. In recent years, demand for non-volatile semiconductor memories serving as data storing devices has become great. As representative electrically rewritable non-volatile memories using a floating gate electrode, NOR flash memories and NAND flash memories are known.

As for a memory cell in a conventional NAND flash memory, an active area, a tunnel insulation film, and a floating gate electrode are formed, for example, as heretofore described (see, for example, Japanese Patent Laid-Open No. 2006-186073).

First, a thermal oxidation film is formed on a silicon substrate, and a polycrystalline silicon layer is formed on the thermal oxidation film. Then, a resist pattern is formed on the polycrystalline silicon layer.

Thereafter, the polycrystalline silicon layer, the thermal oxidation film, and the silicon substrate are etched successively by the dry process, such as, for example, RIE (Reactive Ion Etching) using the resist pattern as a mask. As a result, the active area, the tunnel insulation film, and the floating gate electrode are formed in a self-aligned manner.

At the time of the dry process, both ends of the tunnel insulation film are subjected to plasma damages. As a result, characteristics of the non-volatile memory cell might be degraded.

SUMMARY OF THE INVENTION

According to one aspect of the present invention, there is provided: a semiconductor device comprising:

a semiconductor substrate which includes an active area surrounded by an element isolation insulation film; and a non-volatile memory cell provided on the active area and including: a tunnel insulation film provided on the active area; a floating gate electrode provided on the tunnel insulation film; a control gate electrode provided over the floating gate electrode; and an inter-electrode insulation film provided between the floating gate electrode and the control gate electrode, wherein, in a section of the non-volatile memory cell in a channel width direction, a dimension of a top face of the active area in the channel width direction is equal to or less than a dimension of a top face of the tunnel insulation film in the channel width direction, and the dimension of the top face of the tunnel insulation film in the channel width direction is less than a dimension of a bottom face of the floating gate electrode in the channel width direction.

According to another aspect of the present invention, there is provided: a manufacturing method for a semiconductor device comprising a semiconductor substrate which includes an active area surrounded by an element isolation insulation film, and a non-volatile memory cell provided on the active area, the manufacturing method comprising:

forming a first insulation film serving as a tunnel insulation film on the semiconductor substrate, and then forming a first conductive film serving as a floating gate electrode on the first insulation film;

selectively etching the first conductive film;

forming a first side wall insulation film having a film thickness which is greater than that of the first insulation film on a side wall face of the first conductive film in a channel width direction of the non-volatile memory cell;

forming an element isolation groove by etching the first insulation film and the semiconductor substrate isotropically and etching the semiconductor substrate anisotropically by using the first side wall insulation film as a mask;

forming the element isolation insulation film in the element isolation groove;

forming a second insulation film serving as an inter-electrode insulation film on the first conductive film, and then forming a second conductive film serving as a control gate electrode on the second insulation film; and forming shapes of the control gate electrode, the inter-electrode insulation film, the floating gate electrode and the tunnel insulation film by etching the second conductive film, the second insulation film, the first conductive film and the first insulation film successively.

DETAILED DESCRIPTION

Hereafter, embodiments of the present invention will be described with reference to the drawings.

First Embodiment

Figure 1:
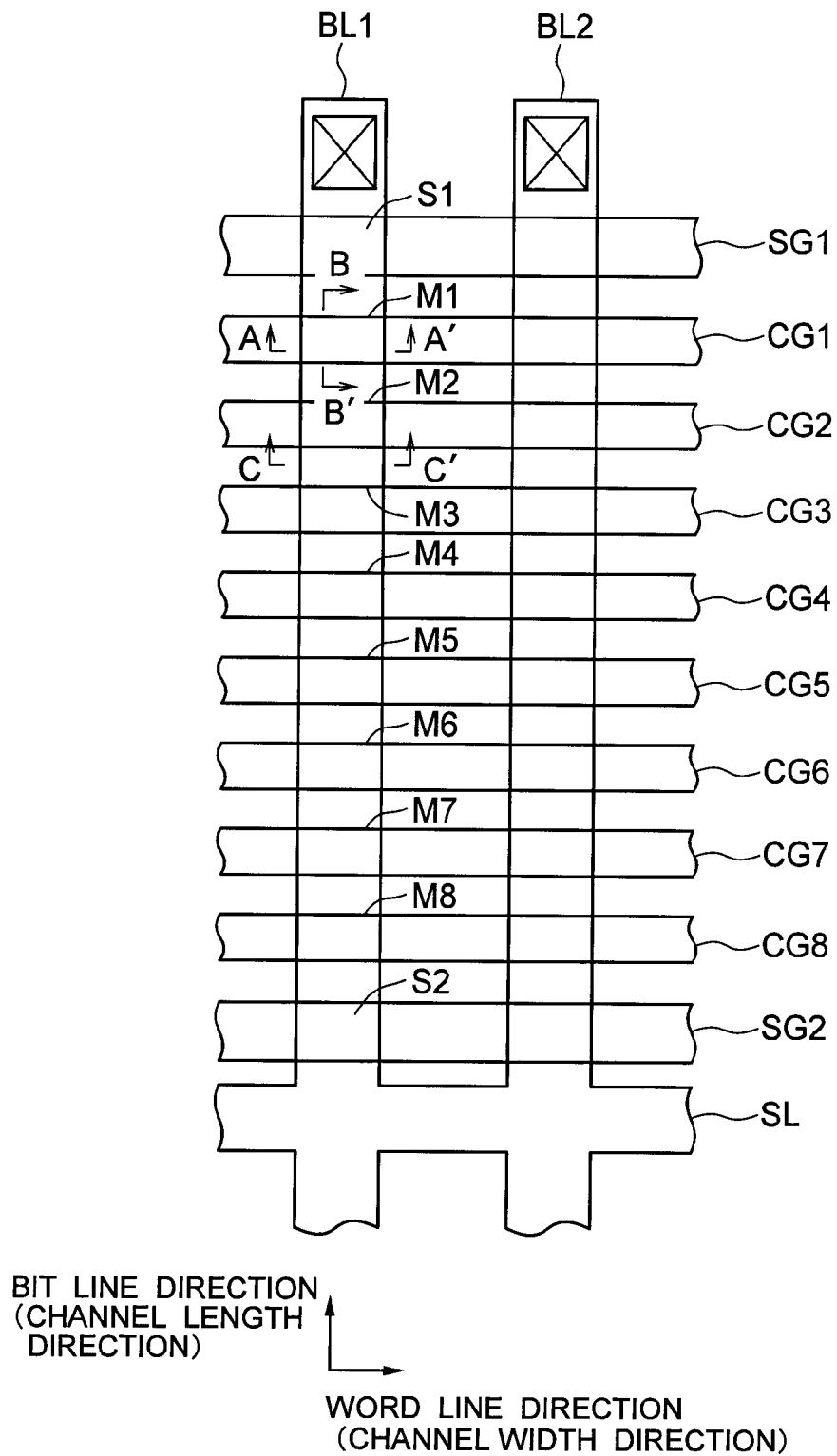
FIG. 1 is a plan view of a memory cell in a NAND flash memory according to a first embodiment of the present invention.
Figure 2:
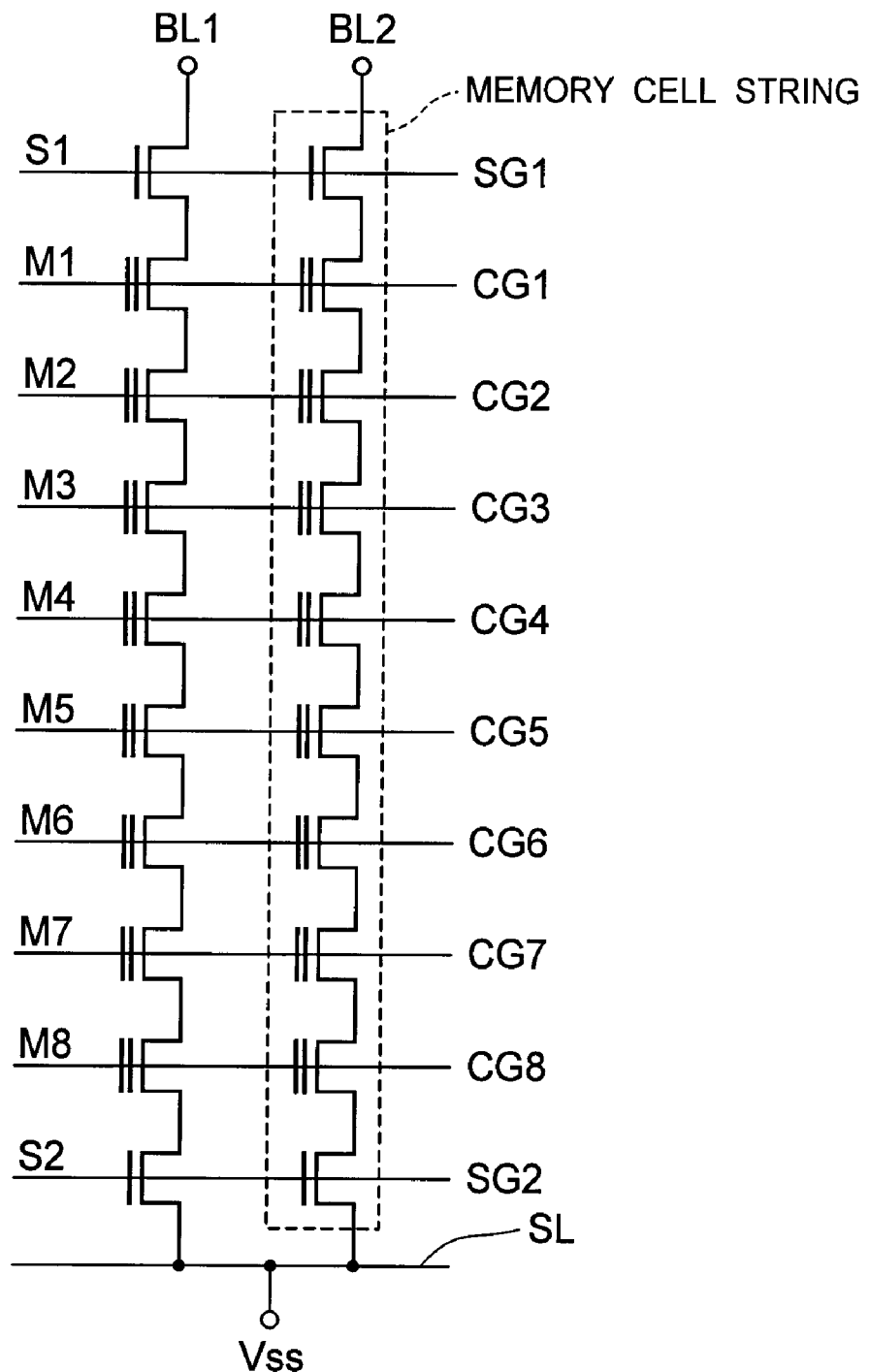
FIG. 2 is an equivalent circuit diagram of a memory cell in the NAND flash memory shown in FIG. 1.

FIG. 1 is a plan view of a memory cell in a NAND flash memory according to a first embodiment of the present invention. FIG. 2 is an equivalent circuit diagram of a memory cell in the NAND flash memory shown in FIG. 1.

As shown in FIGS. 1 and 2, the NAND flash memory includes non-volatile memory cells M1 to M8 respectively having floating gates (word lines) CG1 to CG8, selection transistors S1 and S2 respectively having selection gates SG1 and SG2, bit lines BL1 and BL2, and a source line SL.

The non-volatile memory cells M1 to M8 are connected in series between the selection transistor S1 and the selection transistor S2. A memory cell string is formed of the non-volatile memory cells M1 to M8 and the selection transistors S1 and S2.

Figure 3A:
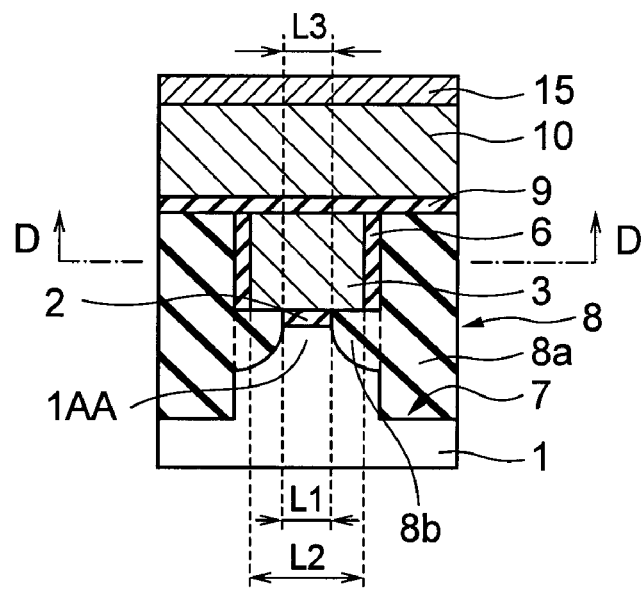
FIG. 3A is an A-A' sectional view of FIG. 1, i.e., a sectional view in a word line direction (channel width direction) on the floating gate (word line) CG1.
Figure 3B:
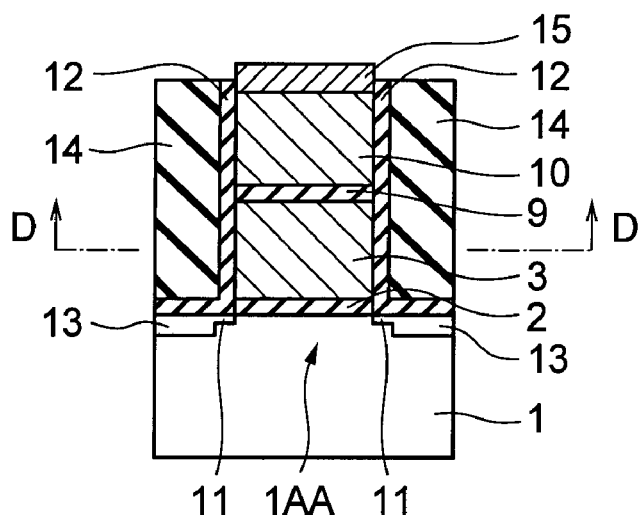
FIG. 3B is a B-B' sectional view of FIG. 1, i.e., a sectional view in a bit line direction (channel length direction)
Figure 3C:
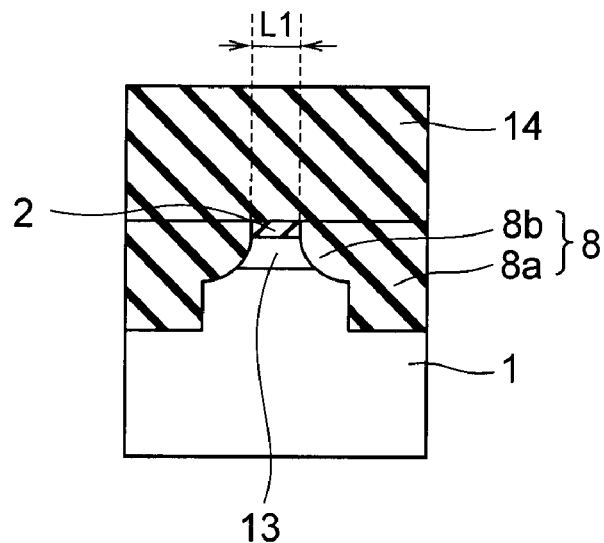
FIG. 3C is a C-C' sectional view of FIG. 1, i.e., a sectional view in the word line direction (channel width direction) between the floating gates (word lines) CG2 and CG3.

FIG. 3A is an A-A' sectional view of FIG. 1, i.e., a sectional view in a word line direction (channel width direction) on the floating gate (word line) CG1. FIG. 3B is a B-B' sectional view of FIG. 1, i.e., a sectional view in a bit line direction (channel length direction). FIG. 3C is a C-C' sectional view of FIG. 1, i.e., a sectional view in the word line direction (channel width direction) between the floating gates (word lines) MC2 and MC3.

As shown in FIGS. 3A and 3B, the NAND flash memory cell according to the present embodiment includes a silicon substrate 1 including an active area 1AA surrounded by an element isolation insulation film 8, and the non-volatile memory cells provided on the active area 1AA.

The element isolation insulation film 8 is formed by filling an element isolation groove 7 formed in the semiconductor substrate 1 with an insulation film (such as a silicon oxide film). The element isolation insulation film 8 includes a first part 8a having a first depth and a second part 8b which is shallower than the first part 8a. It is desirable that the second depth is 20 nm or more from top of a top surface of the active area 1AA. The first depth is in the range of approximately 200 to 500 nm from top of a top surface of the active area 1AA.

The non-volatile memory cell includes a tunnel insulation film 2 provided on the active area 1AA, a floating gate electrode 3 provided on the tunnel insulation film 2, a control gate electrode 10 provided over the floating gate electrode 3, an inter-electrode insulation film 9 provided between the floating gate electrode 3 and the control gate electrode 10, an extension 11, and a source/drain region 13. In order to improve the cutoff characteristics of the memory cell transistor, a bottom face of the source/drain region 13, i.e. a boundary between the source/drain region 13 and the semiconductor substrate 1 may be shallower than the second depth.

In the section of the memory cell in the word line direction (channel width direction), a dimension L1 of a top face of the active area 1AA in the channel width direction is nearly equal to a dimension L3 of a top face of the tunnel insulation film 2 in the channel width direction. In addition, a dimension L3 of the top face of the tunnel insulation film 2 in the channel width direction is less than a dimension L2 of a bottom face of the floating gate electrode 3 in the channel width direction (FIG. 3A).

In the section of the memory cell in the word line direction (channel width direction), it suffices that the dimension L1 of the top face of the active area 1AA in the channel width direction is equal to or less than the dimension L3 of the top face of the tunnel insulation film 2 in the channel width direction.

As a result, it is possible to reduce the area of the tunnel insulation film 2 and increase the coupling ratio of the non-volatile memory cell.

In the section of the memory cell in the word line direction (channel width direction), a first side wall insulation film 6 is formed on a side wall of the floating gate electrode 3 (FIG. 3A). The second part 8b of the element isolation insulation film 8 is formed in a bottom faces of the floating gate electrode 3 and the first side wall insulation film 6, to a side face of the tunnel insulation film 2, and on a part of the active area 1AA. The first part 8a of the element isolation insulation film 8 is formed so as to be in contact with all side faces of the second part 8b and the first side wall insulation film 6 in the word line direction.

A side face of the active area 1AA is in contact with a side face of the first part 8a as well in the word line direction. A width of the active area 1AA sandwiched between parts of the first part 8a is nearly equal to a value obtained by adding twice the film thickness of the first side wall insulation film 6 to the dimension L2. A face of the second part 8b in contact with the active area 1AA and its bottom face nearly have a curved face, and one end of the curved face nearly coincides with an end part of the side wall insulation film 6.

As shown in FIG. 3C, a dimension of the top face of the active area 1AA between parts of the floating gate electrode 3 in the channel width direction is also the dimension L1. The tunnel insulation film 2 is formed on the active area 1AA. The element isolation insulation film 8 includes the second part 8b and the first part 8a in the same way as FIG. 3A. In FIG. 3C, a top face of the first part 8a nearly equal to the top face of the tunnel insulation film 2. However, the top face of the first part 8a might be higher than the top face of the tunnel insulation film 2 or might be lower than that. The source/drain region 13 is formed at the surface in the active area 1AA sandwiched between parts of the second part 8b.

In the channel width direction, the inter-electrode insulation film 9 is formed continuously on top faces of the floating gate electrode 3 and the element isolation insulation film 8a. In other words, the inter-electrode insulation film 9 is formed on all of the top face of the floating gate electrode 3, and the inter-electrode insulation film 9 is not formed on the side face of the floating gate electrode 3 (FIG. 3A).

In the section of the memory cell in the bit line direction (channel length direction), a second side wall insulation film 12 is formed on the side surface of the floating gate electrode 3 (FIG. 3B).

Adjacent floating gate electrodes 3 are insulated from each other by the element isolation insulation film 8 and the inter-layer insulation film 14.

Adjacent control gate electrodes 10 are insulated from each other by the inter-layer insulation film 14 in the channel length direction. For, example, a cobalt silicide film 15 is formed on the control gate electrode 10. By the way, the cobalt silicide film 15 may be nickel silicide or tungsten silicide.

Figure 3D:
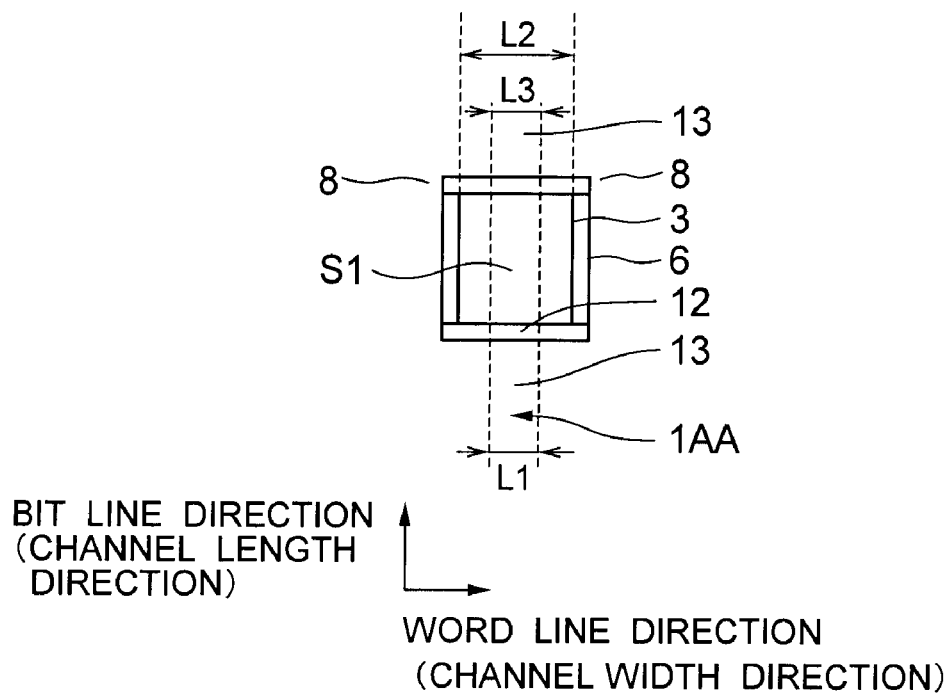
FIG. 3D is a plan view seen along a D-D line shown in FIGS. 3A and 3B.

FIG. 3D is a plan view seen along a D-D line shown in FIGS. 3A and 3B. The side face of the floating gate electrode 3 in the channel width direction is covered by the first side wall insulation film 6, and the side face of the floating gate electrode 3 in the channel length direction is covered by the second side wall insulation film 12. The tunnel insulation film 2 having the width of L3 and extending in the channel length direction is formed under the floating gate electrode 3. The active area 1AA having the width of L1 and extending in the channel length direction is formed under the tunnel insulation film 2. It is supposed that an area of contact between the tunnel insulation film 2 and the floating gate electrode 3 is S1 and an area (corresponding to an area defined by reference numeral 3 in FIG. 3D) of contact between the inter-electrode insulation film 9 and the floating gate electrode 3 is S2.

In the present embodiment, the area S1 of the tunnel insulation film 2 is made smaller than the area S2 of contact between the inter-electrode insulation film 9 and the floating gate electrode 3 as already described. In addition to a dielectric constant and a thickness of the tunnel insulation film 2 and a dielectric constant and a thickness of the inter-electrode insulation film 9, therefore, the area S1 and the area S2 also become parameters which influence upon the coupling ratio.

If the dielectric constant and thickness of the tunnel insulation film 2 and the dielectric constant and thickness of the inter-electrode insulation film 9 are made the same as those in the conventional memory, then the coupling ratio becomes large because of S1<S2.

On the other hand, if the coupling ratio is made the same as that in the conventional memory, then the thickness of the inter-electrode insulation film 9 can be increased. If the thickness of the inter-electrode insulation film 9 is increased, an electric field (current density) generated in the inter-electrode insulation film 9 becomes small. For example, in case of S2 is same as S1 in conventional memory and S2 by three times S1 in this embodiment, if the thickness of the tunnel insulation film 2 is one third of the thickness of the inter-electrode insulation film 9, then the thickness of the inter-electrode insulation film 9 can be increased to three times.

As a result, the magnitude of the electric field generated in the inter-electrode insulation film 9 becomes one third. Even if an insulation layer containing a high dielectric constant material is used as the inter-electrode insulation film 9, occurrence of a leak current flowing through the inter-electrode insulation film 9 is suppressed by thus making the inter-electrode insulation film 9 thicker. Since the occurrence of the leak current is suppressed, the program/erase operation voltage is lowered accordingly.

According to the present embodiment, the relation S1<S2 is implemented as heretofore described. Even in the case where an insulation layer containing high dielectric constant material is used as the inter-electrode insulation film 9, therefore, it is possible to suppress the characteristics degradation of the non-volatile memory cell and increase the coupling ratio by adjusting the thickness of the tunnel insulation film 2 and the thickness of the inter-electrode insulation film 9.

Furthermore, since the first depth is at least 20 nm, electrons are not injected from the silicon substrate 1 into the floating gate electrode 3 via the second part 8b of the element isolation insulation film 8 at the programming. In other words, it becomes possible to increase the coupling ratio effectively. The tunnel insulation film 2 has a film thickness in the range of approximately 5 to 15 nm. By the way, the first depth of at least 20 nm is nearly equivalent to at least twice of the film thickness of the tunnel insulation film 2.

Furthermore, short channel characteristics can be improved because of the distance from the bottom face of the floating gate electrode 3 to boundary between the curved face part where the second part 8b is in contact with the active area 1AA. The short channel characteristics can be further improved by forming the second part 8b of the material having a low dielectric constant of the tunnel insulation film 2.

A method for manufacturing the NAND flash memory according to the present embodiment having a configuration described heretofore will now be described with reference to FIGS. 4A and 4B to FIGS. 12A and 12B.

FIGS. 4A to 12A are sectional views of respective processes at an A-A' section shown in FIG. 1 in the manufacturing method of the semiconductor device according to the first embodiment. FIGS. 4B to 12B are sectional views of respective processes at a B-B' section shown in FIG. 1 in the manufacturing method of the semiconductor device according to the first embodiment. FIG. 7C is an enlarged diagram of an area X shown in FIG. 7B.

Figure 4A:
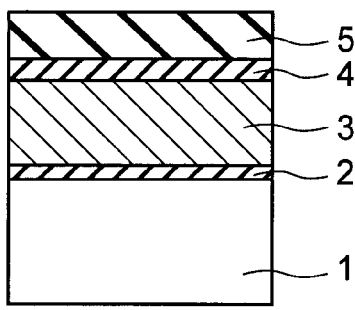
FIG. 4A is a sectional view of respective processes at an A-A' section shown in FIG. 1 in the manufacturing method of the semiconductor device according to the first embodiment.
Figure 4B:
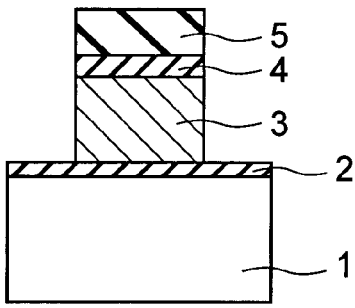
FIG. 4B is a sectional view of respective processes at a B-B' section shown in FIG. 1 in the manufacturing method of the semiconductor device according to the first embodiment.

First, the tunnel insulation film 2 is formed on the surface of the silicon substrate 1 doped with desired impurities by using the thermal oxidation method as shown in FIGS. 4A and 4B. The thickness of the tunnel insulation film 2 is, for example, 10 nm. Furthermore, the tunnel insulation film 2 may be a laminated film of a silicon oxide film and a silicon oxide nitride film, or may be an ONO film formed by sandwiching a silicon nitride film between silicon oxide films.

Then, a polycrystalline silicon layer (a first conductive film) 3 which becomes the floating gate electrode is deposited on the tunnel insulation film 2, a CMP (Chemical Mechanical Polish) stopper film 4 is deposited on the polycrystalline silicon layer, and a RIE (Reactive Ion Etching) mask film 5 is deposited on the CMP stopper film 4 by using the LPCVD (Low Pressure Chemical Vapor Deposition) process. The thickness of the polycrystalline silicon layer 3 is, for example, 150 nm.

Then, the mask film 5, the stopper film 4, and the polycrystalline silicon layer 3 are selectively etched one after another by the RIE process using a resist mask (not illustrated). As a result, the floating gate electrode (polycrystalline silicon layer 3) is formed in a rectangle shape extended in the bit line direction (channel length direction).

In this way, the tunnel insulation film (first insulation film) 2, and the polycrystalline silicon layer 3 which is the first conductive film serving as the floating gate electrode are formed successively on the silicon substrate (semiconductor substrate) 1.

Figure 5A:
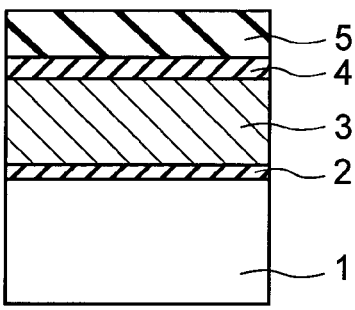
FIG. 5A is a sectional view of respective processes at an A-A' section shown in FIG. 1 in the manufacturing method of the semiconductor device according to the first embodiment, and continuous from FIG. 4A.
Figure 5B:
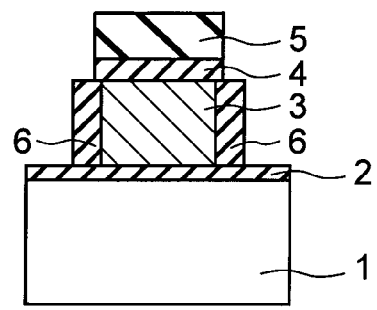
FIG. 5B is a sectional view of respective processes at a B-B' section shown in FIG. 1 in the manufacturing method of the semiconductor device according to the first embodiment, and continuous from FIG. 4B.

Then, as shown in FIGS. 5A and 5B, the first side wall insulation film 6 is formed on the side wall face of the polycrystalline silicon layer 3 by using, for example, the thermal oxidation method.

In this way, the first side wall insulation film 6 having a film thickness which is thicker than that of the tunnel insulation film 2 is formed on the side wall face of the polycrystalline silicon layer 3 of the non-volatile memory cell in the channel width direction. Here, the film thickness of the first side wall insulation film 6 is equal to approximately twice the film thickness of the tunnel insulation film 2.

Figure 6A:
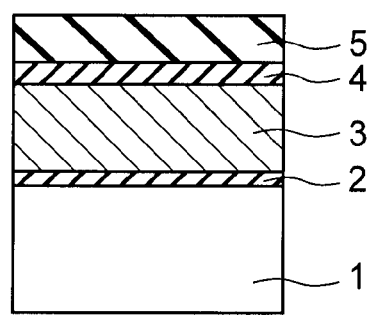
FIG. 6A is a sectional view of respective processes at an A-A' section shown in FIG. 1 in the manufacturing method of the semiconductor device according to the first embodiment, and continuous from FIG. 5A.
Figure 6B:
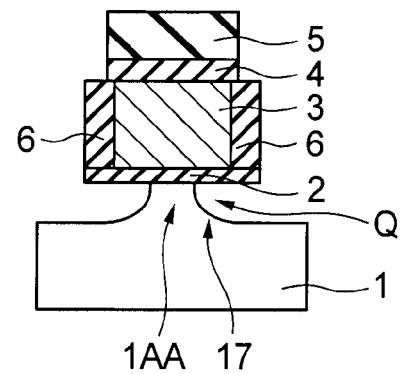
FIG. 6B is a sectional view of respective processes at a B-B' section shown in FIG. 1 in the manufacturing method of the semiconductor device according to the first embodiment, and continuous from FIG. 5B.

As shown in FIGS. 6A and 6B, an area of the tunnel insulation film 2 having an exposed surface is selectively etched by using the RIE process, and a part of the silicon substrate 1 is exposed. At this time, plasma damages might be caused at both ends of the remaining tunnel insulation film (a peripheral nearby part of the floating gate electrode 3) by the RIE process.

Then, the exposed silicon substrate 1 is etched isotropically by using the known downflow process, which is one of etching methods in the vapor phase using the radical, using a mixture gas containing $CF_4$ and oxygen.

For example, the silicon substrate 1 is heated or cooled to a predetermined temperature in the range of 0 to 700° C. Then, $CF_4$ gas (in the range of 1 to 500 cc/minute) is let flow. As a result, the silicon substrate 1 is etched isotropically, and a groove as shown in FIG. 6B is formed. By the way, the gas is not restricted to $CF_4$ gas, but a mixture gas containing $CF_4$ gas and $O_2$ gas, or another gas containing halogen can be used. As a result, the shape of the active area 1AA is determined. Specifically, an active area 1AA including a structure in which the dimension, in the channel width direction, of a part of the active area 1AA opposed to the exposed bottom face of the floating gate electrode 3 becomes greater downward is obtained. The side face of the part which becomes large downward in dimension in the channel width direction includes a face 17 which is convex downward. Furthermore, an air gap Q surrounded by the bottom face of the floating gate electrode 3 and the face 17 is formed.

Figure 6C:
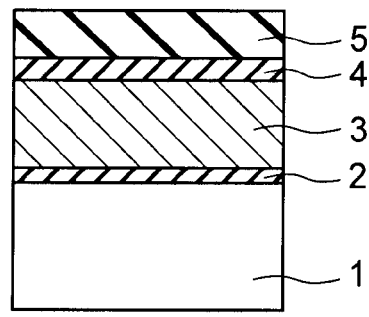
FIG. 6C is a sectional view of respective processes at an A-A' section shown in FIG. 1 in the manufacturing method of the semiconductor device according to the first embodiment, and continuous from FIG. 6A.
Figure 6D:
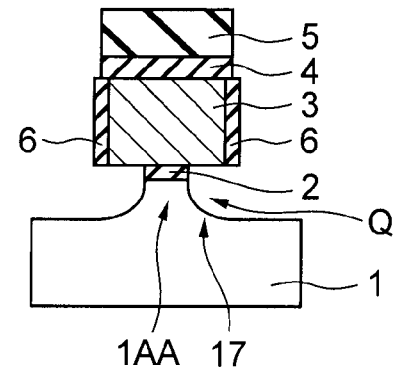
FIG. 6D is a sectional view of respective processes at a B-B' section shown in FIG. 1 in the manufacturing method of the semiconductor device according to the first embodiment, and continuous from FIG. 6B.

Then, the tunnel insulation film 2 is etched isotropically by using HF chemical as shown in FIGS. 6C and 6D. At this time, the first side wall insulation film 6 is also etched. However, the first side wall insulation film 6 has a film thickness which is greater than that of the tunnel insulation film 2 as already described. Although the first side wall insulation film 6 is made thin in film thickness by the isotropic etching, therefore, the first side wall insulation film 6 remains even after the isotropic etching.

In the isotropic etching, parts of the tunnel insulation film 2 subjected to plasma damages caused by the RIE are removed. The reason is as follows: if the film thickness of the first side wall insulation film 6 is too great, then the width of the element isolation groove 7 formed in a subsequent process becomes short and leaks of adjacent memory cell strings become great. On the other hand, if the film thickness of the first side wall insulation film 6 is thin, then the parts of the tunnel insulation film 2 subjected to plasma damages cannot be removed sufficiently. Therefore, the film thickness of the first side wall insulation film 6 after this process may become nearly the film thickness of the tunnel insulation film 2. Furthermore, an air gap Q will become the second part 8b of the element isolation insulation film later.

Figure 7A:
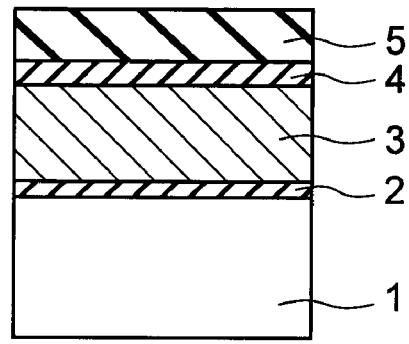
FIG. 7A is a sectional view of respective processes at an A-A' section shown in FIG. 1 in the manufacturing method of the semiconductor device according to the first embodiment, and continuous from FIG. 6C.
Figure 7B:
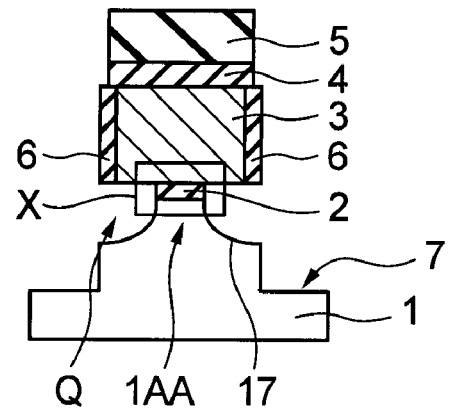
FIG. 7B is a sectional view of respective processes at a B-B' section shown in FIG. 1 in the manufacturing method of the semiconductor device according to the first embodiment, and continuous from FIG. 6D.
Figure 7C:
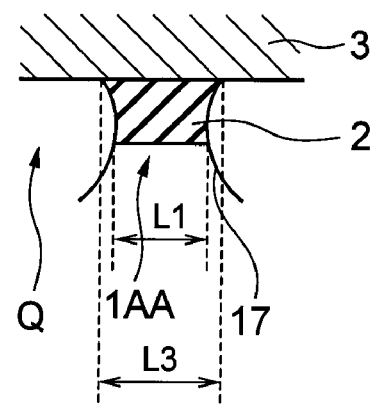
FIG. 7C is an enlarged diagram of an area X shown in FIG. 7B.

In some cases, the upper part of the tunnel insulation film 2 takes a tapered shape depending upon the condition of the etching, as a result of the process as shown in FIG. 7C. Furthermore, the side face of the tunnel insulation film 2 becomes a curved face concaved in its central part. In other words, in the section of the memory cell in the word line direction (channel width direction), a dimension L1 of a top face of the active area 1AA in the channel width direction is shorter than a dimension L3 of a top face of the tunnel insulation film 2 in the channel width direction. In addition, a dimension L3 of the top face of the tunnel insulation film 2 in the channel width direction becomes less than a dimension L2 of a bottom face of the floating gate electrode 3 in the channel width direction.

As shown in FIGS. 7A and 7B, an exposed area of the silicon substrate 1 is etched in anisotropically by an RIE process using the first side wall insulation film 6 and the mask film 5 as a mask. As a result, the element isolation groove 7 is formed in a self-aligned manner. This part will become the first part 8a of the element isolation insulation film later. The element isolation insulation groove 7 has a depth of, for example, 150 nm.

Since the first side wall insulation film 6 is formed on the side face of the floating gate electrode 3, process damages caused by REI are prevented from entering the floating gate electrode 3.

The tunnel insulation film 2, the first side wall insulation film 6 and the silicon substrate 1 are etched by the processes shown in FIGS. 6A, 6B, 6C, 6D, 7A and 7B and described heretofore. In other words, the tunnel insulation film 2, the first side wall insulation film 6 and the silicon substrate 1 are etched isotropically. Thereafter, the silicon substrate 1 is etched anisotropically. As a result, the element isolation groove 7 is formed.

As a result, the element isolation groove 7 which defines the active area 1AA and which defines the shape of the tunnel insulation film 2 in the channel width direction is formed on the silicon substrate 1.

The element isolation groove 7 is formed so as to satisfy a condition especially in the channel width direction that the dimension of the top face of the active area 1AA in the channel width direction is equal to or less than the dimension of the top face of the tunnel insulation film 2 in the channel width direction and the dimension of the top face of the tunnel insulation film 2 in the channel width direction is less than the dimension of the bottom face of the polycrystalline silicon layer (floating gate electrode) 3 in the channel width direction (FIGS. 6D and 7B).

When forming the element isolation groove 7, parts of the tunnel insulation film 2 subjected to plasma damages when forming the floating gate electrode 3 are removed as already described. In other words, the remaining tunnel insulation film 2 has superior characteristics because it is not subjected to plasma damages. As a result, degradation of characteristics in the non-volatile memory cell can be avoided unlike the conventional art.

Figure 8A:
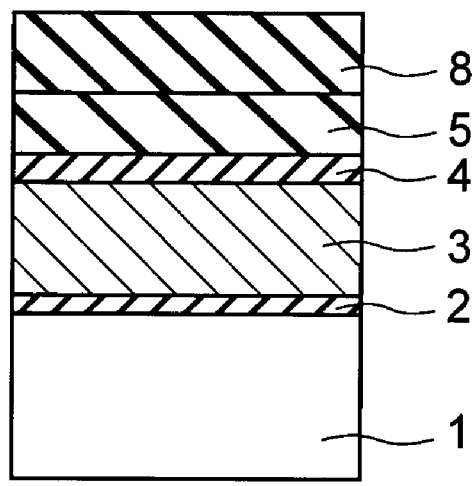
FIG. 8A is a sectional view of respective processes at an A-A' section shown in FIG. 1 in the manufacturing method of the semiconductor device according to the first embodiment, and continuous from FIG. 7A.
Figure 8B:
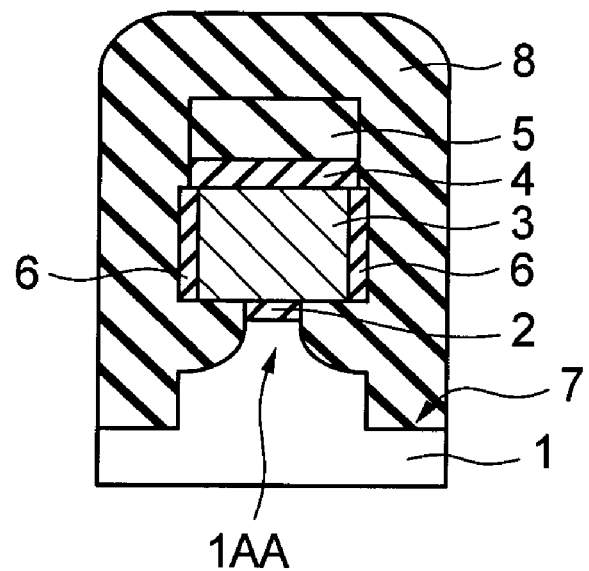
FIG. 8B is a sectional view of respective processes at a B-B' section shown in FIG. 1 in the manufacturing method of the semiconductor device according to the first embodiment, and continuous from FIG. 7B.

As shown in FIGS. 8A and 8B, a silicon oxide film (not illustrated) is formed on the exposed surface of the silicon substrate 1 (a bottom face and a side face of the element isolation groove 7) by thermal oxidation method. A silicon oxide film is formed on an exposed bottom face of the floating gate electrode 3 as well (not illustrated). Then, the element isolation insulation film 8 is deposited on the whole surface so as to bury the element isolation groove 7 and the air gap Q by a plasma CVD process. Specifically, the second part 8b of the element isolation insulation film 8 is formed in a part surrounded by the bottom faces of the floating gate electrode 3 and the first side wall insulation film 6, the side face of the tunnel insulation film 2, and the active area 1AA. The first part 8a of the element isolation insulation film 8 is formed in contact with side faces of the second part 8b and the first side wall insulation film 6.

As the element isolation insulation film 8, for example, a silicon oxide film is used. The silicon oxide film which is not illustrated has a thickness of, for example, 5 nm, and the element isolation insulation film 8 has a thickness of, for example, 400 nm.

For effectively burying the element isolation insulation film into the air gap Q, a process described hereafter should be adopted.

In other words, an insulation film including a silicon oxide film formed by the plasma CVD process and a silicon oxide film (applied film) formed by the applying method (or a silicon oxide film formed by the thermal CVD process) is buried into the element isolation groove 7.

Specifically, the element isolation insulation film 8 is buried into the groove area which is formed in the element isolation groove 7 by the RIE process in the process shown in FIGS. 7A and 7B. Then, the silicon oxide film (applied film) formed by the applying method or the silicon oxide film formed by the thermal CVD process is buried into the remaining groove area (the air gap Q).

Then, an upper part of the element isolation insulation film 8 and the mask film 5 are removed by the CMP process so as to expose the stopper film 4 and make the surface flat.

Figure 9A:
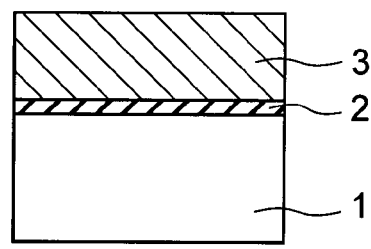
FIG. 9A is a sectional view of respective processes at an A-A' section shown in FIG. 1 in the manufacturing method of the semiconductor device according to the first embodiment, and continuous from FIG. 8A.
Figure 9B:
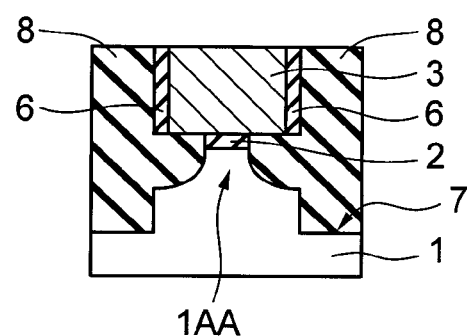
FIG. 9B is a sectional view of respective processes at a B-B' section shown in FIG. 1 in the manufacturing method of the semiconductor device according to the first embodiment, and continuous from FIG. 8B.

Then, the element isolation insulation film 8 is etched by a thickness equivalent to the thickness of the stopper film 4 by using a hydrogen fluoride solution. In addition, the exposed stopper film 4 is removed by a phosphoric acid as shown in FIGS. 9A and 9B.

As a result, a top face of the element isolation insulation film 8 becomes approximately the same in height as a top face of the polycrystalline silicon layer 3. The element isolation insulation film 8 which surrounds the active area 1AA surrounds peripheries of the tunnel insulation film 2 and the floating gate electrode 3 as well.

In this way, the element isolation insulation film 8 is formed in the element isolation groove 7.

Figure 10A:
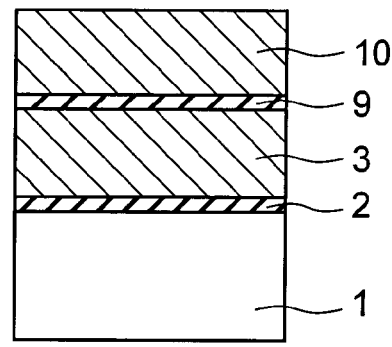
FIG. 10A is a sectional view of respective processes at an A-A' section shown in FIG. 1 in the manufacturing method of the semiconductor device according to the first embodiment, and continuous from FIG. 9A.
Figure 10B:
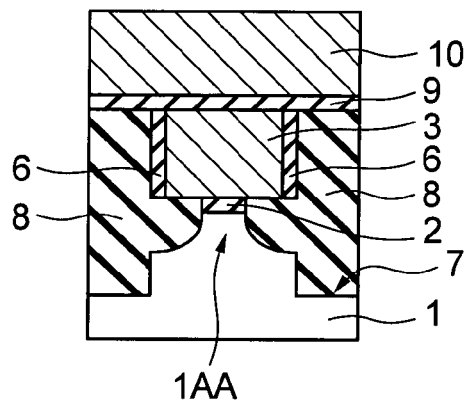
FIG. 10B is a sectional view of respective processes at a B-B' section shown in FIG. 1 in the manufacturing method of the semiconductor device according to the first embodiment, and continuous from FIG. 9B.

As shown in FIGS. 10A and 10B, a high dielectric constant insulation film which becomes the inter-electrode insulation film 9 is deposited on the whole face by an ALCVD (Atomic Layer Chemical Vapor Deposition) process. Thereafter, a polycrystalline silicon layer doped with phosphorus which becomes the control gate electrode 10 is deposited on the high dielectric constant insulation film.

The high dielectric constant insulation film is an insulation film having a dielectric constant of, for example, 6.0 or more. Specifically, a single layer or a multi-layer insulation film containing at least one of silicon nitride, aluminum oxide, hafnium oxide, tantalum oxide, titanium oxide and silicate can be mentioned. Here, an alumina film having a thickness of 15 nm is used as the high dielectric constant insulation film.

In this way, the inter-electrode insulation film (second insulation film) 9 is formed on the polycrystalline silicon layer 3, and the polycrystalline silicon layer (second conductive film which is the control gate electrode) 10 is then formed on the inter-electrode insulation film (second insulation film) 9.

Figure 11A:
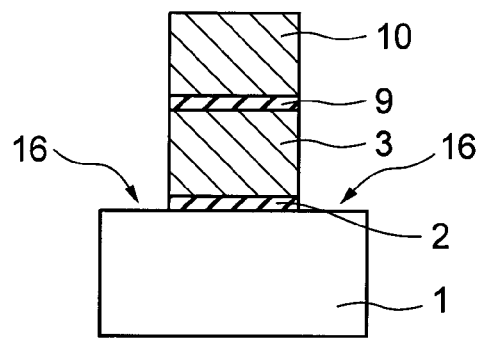
FIG. 11A is a sectional view of respective processes at an A-A' section shown in FIG. 1 in the manufacturing method of the semiconductor device according to the first embodiment, and continuous from FIG. 10A.
Figure 11B:
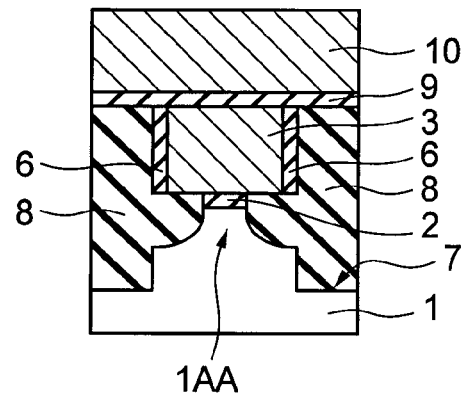
FIG. 11B is a sectional view of respective processes at a B-B' section shown in FIG. 1 in the manufacturing method of the semiconductor device according to the first embodiment, and continuous from FIG. 10B.

As shown in FIGS. 11A and 11B, a mask film (not illustrated) is formed on the polycrystalline silicon layer 10 and a resist pattern (not illustrated) is formed on the mask film. Then, the mask film is etched by using the resist pattern as a mask in a RIE process. In addition, the polycrystalline silicon layer 10, the high dielectric constant insulation film 9, the polycrystalline silicon layer 3, and the tunnel insulation film 2 are etched successively by using the resist pattern and the mask film as a mask in a RIE process.

As a result, a slit part 16 is formed between a part of the control gate electrode and a memory cell adjacent in the bit line direction (channel length direction). The slit parts 16 define shapes of the control gate electrode 10, the inter-electrode insulation film 9, the floating gate electrode 3 and the tunnel insulation film 2.

In other words, the shapes of the control gate electrode 10, the inter-electrode insulation film 9, the floating gate electrode 3 and the tunnel insulation film 2 are defined by etching the polycrystalline layer 10, the inter-electrode insulation film 9, the polycrystalline silicon layer 3 and the tunnel insulation film 2 successively.

Figure 12A:
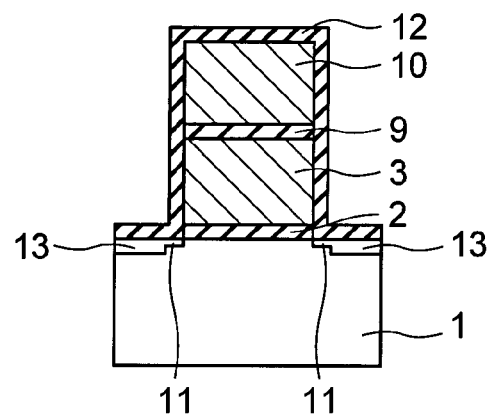
FIG. 12A is a sectional view of respective processes at an A-A' section shown in FIG. 1 in the manufacturing method of the semiconductor device according to the first embodiment, and continuous from FIG. 11A.
Figure 12B:
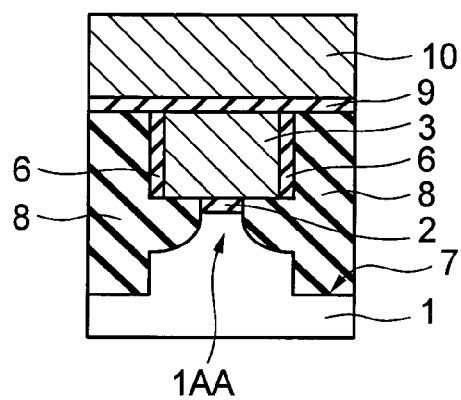
FIG. 12B is a sectional view of respective processes at a B-B' section shown in FIG. 1 in the manufacturing method of the semiconductor device according to the first embodiment, and continuous from FIG. 11B.

As shown in FIGS. 12A and 12B, an extension 11 is formed at the surface of the silicon substrate 1 by using an ion implantation process and an anneal process.

Then, a silicon oxide film (the second side wall insulation film) 12 is formed on surfaces (a top face and a side face) of a gate part (the tunnel insulation film 2, the floating gate electrode 3, the inter-electrode insulation film 9 and the control gate electrode 10) and the exposed surface of the silicon substrate 1 by using the thermal oxidation method and a LPCVD process. The silicon oxide film 12 has a thickness of, for example, 10 nm. The insulation film such as the silicon oxide film 12 is called electrode side wall insulation film (spacer).

Then, the source/drain region 13 is formed at the surface of the silicon substrate 1 by using the ion implantation process and the anneal process again.

Then, a BPSG (Borophosphosilicate Glass) film which becomes the inter-layer insulation film 14 is deposited over the whole surface by using the LPCVD process. Thereafter, the BPSG film and the silicon oxide film 12 are polished in a CMP process until a top face of the control gate electrode 10 is exposed.

Then, a Co film is deposited on the whole surface, and a TiN film is deposited on the Co film, in a sputter process. A reaction of Si and Co to cobalt silicide ($CoSi_2$) is caused on a top face of the control gate electrode (polycrystalline silicon film) in an RTA process. Subsequently, the TiN film and the Co film which has not yet reacted are removed by chemical processing.

As a result, a cobalt silicide film 15 is formed on the top face of the control gate electrode 10. By the way, a metallic silicide film other than the cobalt silicide film 15 may also be formed.

In this way, the non-volatile memory cell shown in FIGS. 3A and 3B is obtained.

Thereafter, well-known processes such as the interconnection layer forming process are executed, and a NAND flash memory is obtained.

According to the present embodiment, characteristics of the non-volatile memory can be improved as heretofore described.

Second Embodiment

Figure 13:
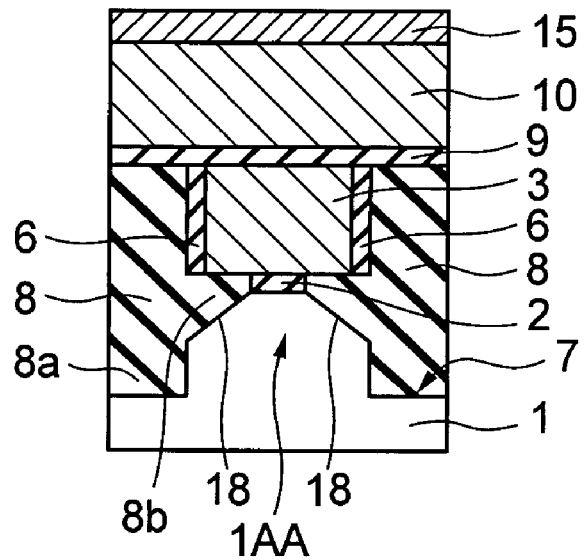
FIG. 13 is a sectional view showing a memory cell in a NAND flash memory according to a second embodiment of the present invention.

FIG. 13 is a sectional view showing a memory cell in a NAND flash memory according to a second embodiment of the present invention. FIG. 13 shows a section in the channel width direction corresponding to FIG. 3B. In FIG. 13, parts corresponding to those shown in FIG. 3B are denoted by like reference characters in FIG. 3B, and detailed description of them will not be described.

The present embodiment differs from the first embodiment in that a side face of a part of the active area 1AA opposed to the tunnel insulation film 2, i.e., a face where the second part 8b of the element isolation insulation film is in contact with the active area 1AA includes a nearly flat face 18.

For example, in the process shown in FIGS. 6A to 6D according to the first embodiment, the silicon substrate 1 is etched isotropically in a wet process (wet etching) using an etchant which increases the etching rate of Si as compared with $SiO_2$, such as, for example, KOH, instead of the down-flow process. In addition, the tunnel insulation film 2 is etched by using HF chemical. As a result, a structure as shown in FIG. 13 is obtained.

In some cases, the tunnel insulation film 2 may take the shape as shown in FIG. 7C.

This is because the etching face has an inclination depending upon the crystal plane such as, for example, a (111) plane or (110) plane in the case of the wet process using KOH. In the case where the principal plane of the silicon substrate 1 is the (100) plane and its orientation is <010>, the orientation of the flat plane becomes <101>.

In the case of the above-described structure as well, the coupling ratio increases in the same way as the first embodiment. As a result, the electric field generated in the inter-electrode insulation film 9 is weakened and effects similar to those in the first embodiment are obtained. In addition, since parts of the tunnel insulation film 2 subjected to plasma damages are removed by the RIE in the same way as the first embodiment, characteristics of the non-volatile memory cell can be improved.

According to the present embodiment, characteristics of the non-volatile memory cell can be improved in the same way as the first embodiment, as heretofore described.

Third Embodiment

Figure 14:
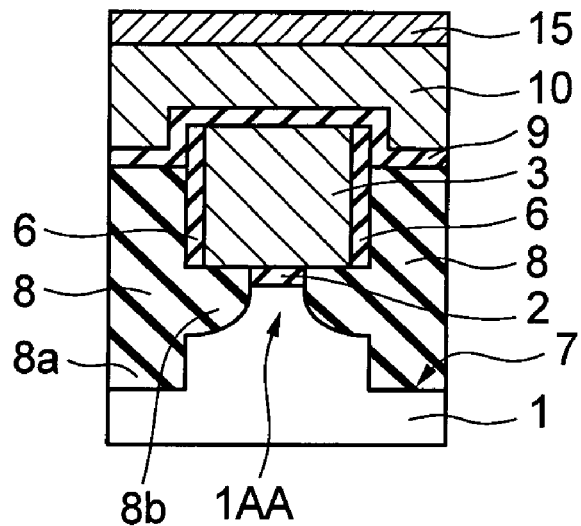
FIG. 14 is a sectional view showing a memory cell in a NAND flash memory according to a third embodiment of the present invention.

FIG. 14 is a sectional view showing a memory cell in a NAND flash memory according to a third embodiment of the present invention. FIG. 14 shows a section in the channel width direction corresponding to FIG. 3B. In FIG. 14, parts corresponding to those shown in FIG. 3B are denoted by like reference characters in FIG. 3B, and detailed description of them will not be described.

The present embodiment differs from the first embodiment in that in the channel width direction the inter-electrode insulation film 9 is provided on an upper side face of the floating gate electrode 3 as well.

Such a structure is obtained by increasing the quantity of the etching of the element isolation insulation film 8 conducted by using the hydrogen fluoride solution and exposing the upper side face of the floating gate electrode 3 in the process shown in FIG. 9 according to the first embodiment.

According to the above-described structure, the area of opposition between the floating gate electrode 3 and the inter-electrode insulation film 9 becomes greater than that in the first embodiment, and consequently the coupling ratio can be further increased.

For implementing the above-described structure, the thickness of the floating gate electrode 3 may be increased. Therefore, the size of the upper side face of the exposed floating gate electrode 3 is determined by considering electric characteristics of the memory cell (electric interference between cells) and the RIE process shown in FIGS. 11A and 11B.

According to the present embodiment, characteristics of the non-volatile memory cell can be improved in the same way as the first embodiment, as heretofore described.

The present invention is not restricted to the embodiments described above. For example, in the embodiments, the case where the silicon substrate is used as the semiconductor substrate has been described. However, other semiconductor substrates may be used. For example, a SOI substrate or a semiconductor substrate containing a SiGe region in the active area may be used.

The present invention can also be applied to a semiconductor device (mixedly mounting LSI) including a flash memory and a logic circuit.

The present invention is not restricted to the above-described embodiments as they are, but can be embodied with components deformed without departing from the spirit thereof in the embodying stage.

Furthermore, various inventions can be formed by a suitable combination of a plurality of components disclosed in the above-described embodiments. For example, several components may be removed from all components shown in an embodiment. In addition, components in different embodiments may be combined suitably.

In addition, various modifications can be made without departing from the spirit of the present invention.

What is claimed is:

1. A semiconductor device comprising:
   a semiconductor substrate which includes an active area surrounded by an element isolation insulation film; and
   a non-volatile memory cell provided on the active area and including: a tunnel insulation film provided on the active area; a floating gate electrode provided on the tunnel insulation film; a control gate electrode provided on the floating gate electrode; and an inter-electrode insulation film provided between the floating gate electrode and the control gate electrode, wherein, in a section of the non-volatile memory cell in a channel width direction, a dimension of a top face of the active area in the channel width direction is less than a dimension of a top face of the tunnel insulation film in the channel width direction, and the dimension of the top face of the tunnel insulation film in the channel width direction is less than a dimension of a bottom face of the floating gate electrode in the channel width direction.

2. The semiconductor device according to claim 1, wherein a whole side face of the floating gate electrode in the channel width direction is in contact with the element isolation insulation film via a side wall insulation film, and the inter-electrode insulation film is formed continuously on top faces of the floating gate electrode and the element isolation insulation film.

3. The semiconductor device according to claim 1, wherein the element isolation insulation film surrounding the active area further surrounds a periphery of the tunnel insulation film and the floating gate electrode.

4. The semiconductor device according to claim 2, wherein the element isolation insulation film surrounding the active area further surrounds a periphery of the tunnel insulation film and the floating gate electrode.

5. The semiconductor device according to claim 1, wherein an upper part of the tunnel insulation film takes a tapered shape.

6. The semiconductor device according to claim 4, wherein an upper part of the tunnel insulation film takes a tapered shape.

7. The semiconductor device according to claim 1, wherein a side face of the tunnel insulation film is a curved face concaved in its central part.

8. The semiconductor device according to claim 5, wherein a side face of the tunnel insulation film is a curved face concaved in its central part.

* * * * *